United States Patent
Watanabe et al.

(10) Patent No.: US 7,679,148 B2
(45) Date of Patent: Mar. 16, 2010

(54) SEMICONDUCTOR DEVICE, PRODUCTION METHOD AND PRODUCTION DEVICE THEREOF

(75) Inventors: Heiji Watanabe, Tokyo (JP); Hirohito Watanabe, Tokyo (JP); Toru Tatsumi, Tokyo (JP); Shinji Fujieda, Tokyo (JP)

(73) Assignee: NEC Corporation, Tokyo (JP)

( * ) Notice: Subject to any disclaimer, the term of this patent is extended or adjusted under 35 U.S.C. 154(b) by 352 days.

(21) Appl. No.: 10/521,311

(22) PCT Filed: Jul. 16, 2003

(86) PCT No.: PCT/JP03/09052

§ 371 (c)(1),
(2), (4) Date: Jan. 14, 2005

(87) PCT Pub. No.: WO2004/008544

PCT Pub. Date: Jan. 22, 2004

(65) Prior Publication Data

US 2005/0233526 A1    Oct. 20, 2005

(30) Foreign Application Priority Data

Jul. 16, 2002    (JP)    ............................. 2002-206678

(51) Int. Cl.
*H01L 29/76*    (2006.01)
(52) U.S. Cl. ...................... 257/411; 257/406; 257/410; 257/636; 257/E29.132; 257/E29.165
(58) Field of Classification Search ................. 257/406, 257/410, 411, 636, 651, E29.132, E29.162, 257/E29.165
See application file for complete search history.

(56) References Cited

U.S. PATENT DOCUMENTS

| 6,586,349 | B1 * | 7/2003 | Jeon et al. | .................... 438/785 |
| 6,703,277 | B1 * | 3/2004 | Paton et al. | ................. 438/287 |
| 2001/0023120 | A1 | 9/2001 | Tsunashima et al. | |

(Continued)

FOREIGN PATENT DOCUMENTS

JP    S58-9331 A    6/1983

(Continued)

*Primary Examiner*—Matthew E Warren
(74) *Attorney, Agent, or Firm*—Sughrue Mion, PLLC

(57) ABSTRACT

The task of the present invention is to enable formation of a gate insulating film structure having a good-quality interface between a silicon oxide film and silicon in an interface between a high dielectric constant thin film and a silicon substrate to provide a semiconductor device and a semiconductor manufacturing method which are capable of improving interface electrical characteristics, which has been a long-standing task in practical use of a high dielectric constant insulating film. A metal layer deposition process and a heat treatment process which supply metal elements constituting a high dielectric constant film on a surface of a base silicon oxide film 103 allow the metal elements to be diffused into the base silicon oxide film 103 to thereby form an insulating film structure 105 as a gate insulating film, after forming the base silicon oxide film 103 on a surface of a silicon substrate 101. The insulating film structure 105 including a silicate region comprises a silicon oxide film region, a silicate region, and a metal rich region, forming a silicate structure having composition modulation in which composition of metal increases as closer to an upper portion, and the composition of silicon increases as closer to a lower portion.

1 Claim, 16 Drawing Sheets

U.S. PATENT DOCUMENTS

| | | |
|---|---|---|
| 2003/0127640 A1 | 7/2003 | Eguchi et al. |
| 2003/0137019 A1* | 7/2003 | Maria et al. .................. 257/410 |
| 2003/0219972 A1* | 11/2003 | Green et al. ................. 438/623 |
| 2005/0009371 A1* | 1/2005 | Metzner et al. ............. 438/785 |
| 2006/0054980 A1* | 3/2006 | Kim et al. .................... 257/410 |

FOREIGN PATENT DOCUMENTS

| | | |
|---|---|---|
| JP | S62-11559 A | 5/1987 |
| JP | 2001257344 A | 9/2001 |
| JP | 2001-332547 A | 11/2001 |
| JP | 2002-184773 A | 6/2002 |
| JP | 2002-184779 A | 6/2002 |
| JP | 20038011 A | 1/2003 |
| JP | 2003-158262 A | 5/2003 |
| JP | 2003204061 A | 7/2003 |
| JP | 2004259906 A | 9/2004 |

* cited by examiner

SEMICONDUCTOR DEVICE, PRODUCTION METHOD AND PRODUCTION DEVICE THEREOF

TECHNICAL FIELD

The present invention relates to a semiconductor device having a high dielectric constant thin film, and manufacturing method and manufacturing apparatus thereof, more particularly, to a semiconductor device which provides higher performance and lower power consumption of a gate insulating film which constitutes an MOSFET (Metal-Oxide-Semiconductor Field Effect Transistor), and manufacturing method and manufacturing apparatus thereof.

BACKGROUND OF THE ART

Silicon oxide films have process stability and excellent electrical insulation, and are being used for gate insulating materials of an MOSFET. With device miniaturization in recent years, thinning of a gate insulating film has been increasingly growing, and a device with a gate length of 100 nm or less requires a thickness of a silicon oxide film which is the gate insulating film, to be 1.5 nm or less from a requirement of the scaling law. However, if such an ultra-thin insulating film is used, upon applying gate bias voltage to a gate electrode, the magnitude of tunneling current sandwiched between a gate insulating layer and the gate electrode becomes an unignorable value against source/drain current, and exceeds a permissible range of device design. This would be a big barrier to promoting higher performance and lower power consumption of the MOSFET. Accordingly, research and development is proceeding with the aim to thin a film thickness of an effective gate insulating film and to control the tunneling current to within the permissible values.

One of them is a method of adding nitrogen into a silicon oxide film to thereby increase dielectric constant more than that of a pure silicon oxide film, and to reduce a film thickness of an effective, namely, electrical gate insulating layer without thinning a physical film thickness. Fabricating techniques of such a silicon oxynitride film include a method of making high-temperature heat treatment of the silicon oxide film in gas containing nitrogen such as ammonia ($NH_3$) to thereby introduce the nitrogen into the silicon oxide film after forming the silicon oxide film on a surface of a silicon substrate. However, this method gives rise to a problem that the heat treatment in gas atmosphere causes segregation of the nitrogen into an interface between the silicon oxide film and the silicon substrate to produce deterioration of interface electrical characteristics. In the case of a silicon oxide film, it is generally possible to realize a good quality junction with less interface roughness and defect density. However, if a silicon oxynitride film is fabricated by the aforementioned technique, the interface roughness and the interface defect density will be increased by the segregated nitrogen in the interface.

Therefore, a technology (plasma nitriding technology) in which a silicon oxide film is exposed to nitrogen plasma to selectively nitride a surface side has been studied in recent years. In the technology applying this plasma, it is possible to control nitrogen concentration of an interface to a lower level and to minimize electrical characteristic deterioration caused by the aforementioned nitrogen. However, relative dielectric constant of a pure silicon oxynitride film is only twice as many as that of the silicon oxide film, and higher dielectric constant of an insulating film by nitrogen addition to the silicon oxide film has limitations. Thus increasing the relative dielectric constant to not less than 10 is impossible in principle.

Accordingly, as the next-generation technology in which the device miniaturization is moving ahead, an attempt is further being made to adopt thin film materials with relative dielectric constant of not less than 10, or a silicate thin film which is a composite material of these materials and silicon as the gate insulating film, in place of the silicon oxide film or an oxynitride film. As these high dielectric constant materials, $Al_2O_3$, $ZrO_2$, or $HfO_2$, and rare-earth element oxides such as $Y_2O_3$, and further lanthanoide rare earth element oxides such as $La_2O_3$ are being studied as candidate materials. This basis is that there exists a thickness that use of these high dielectric constant films would allow prevention of the tunneling current, while maintaining capacity of the gate insulating film in accordance with the scaling law, even if the gate length is miniaturized.

Note that assuming that the gate insulating materials are the silicon oxide films regardless of type of the gate insulating film, the film thickness obtained from back calculation of gate capacity is called Silicon Effective Oxide Thickness. More specifically, letting the relative dielectric constant of the insulating film and the relative dielectric constant of the silicon oxide film eh and eo, respectively, and the thickness of the insulating film dh, the Silicon Effective Oxide Thickness makes de=dh (eo/eh). This formula indicates that if a material having dielectric constant eh larger than eo is used, even an insulating film having a thick physical film thickness can be effectively and electrically equivalent to a thin silicon oxide film. The relative dielectric constant eo of the silicon oxide film is approximately 3.9, so that, for example, if a high dielectric film having relative dielectric constant eh=39 which is ten times as high as that is used, even the physical film thickness of the insulating film having a thickness of 15 nm will effectively and electrically make the Silicon Effective Oxide Thickness of 1.5 nm, enabling drastic reduction of the tunneling current.

In addition, each of a metal oxide and a silicate thin film features the following. If the metal oxides such as $ZrO_2$ and $HfO_2$ are used as a high dielectric constant gate insulating film, higher relative dielectric constant may be achieved. On the other hand, it is believed that although the relative dielectric constant decreases in a silicate material in which silicon is contained, thermal stability is enhanced, as well as the interface electrical characteristics may be improved as compared with the case where the metal oxides are directly joined onto the silicon substrate.

As described above, development of the next-generation MOSFET is considering to adopt the high dielectric constant thin film as the gate insulating film materials, and to adopt CVD (Chemical Vapor Deposition) using different kinds of source gas, or ALD (Atomic Layer Chemical Vapor Deposition) which controls CVD deposition on an atomic layer basis, as deposition techniques of the high dielectric constant thin film onto the surface of the silicon substrate.

In an initial stage of development of the high dielectric constant gate insulating film, a physical evaporation method such as sputtering, reactive sputtering, or Molecular Beam Deposition has been used with the aim of material search. In these deposition techniques, reported are examples in which a high dielectric constant film has been directly deposited on a surface of a silicon substrate, and in which an ultra-thin silicon oxide film, to be more precise, with a thickness of normally less than 1 nm, has been inserted into an interface between a high dielectric constant thin film and the silicon substrate for the purpose of controlling an early reaction of CVD or ALD deposition, and of improving thermal stability of the interface between the high dielectric constant thin film and the silicon substrate. In the latter case, the ultra-thin silicon oxide film is formed on the surface of the silicon substrate, and then the deposition of the high dielectric constant thin film is carried out by different kinds of deposition methods. Commonalties in these deposition techniques are that stoichiometric composition on the surface of the silicon substrate, or the deposition of the high dielectric constant film in agreement with silicate composition which is neither too much nor too little in oxygen concentration is necessary, and in particular, a structural defect such as an oxygen deficiency in a film causes deterioration of electrical characteristics and increase in leakage current.

With respect to various high dielectric constant materials fabricated by the aforementioned thin film deposition methods, the characteristics have been studied heretofore. Among these, the biggest technical problem toward the development of the next-generation MOSFET is improvement in the interface electrical characteristics between the high dielectric constant thin film and the silicon substrate. More specifically, the interface defect density between the high dielectric constant thin film interface and the silicon substrate is higher by one to two digits than the interface defect density between the silicon oxide film and the silicon substrate, deterioration of the mobility becomes significant due to charge captured by the interface defect, and current drive capability of the MOSFET declines. This cancels out the effect that the gate insulating film has been thinned.

As for means to improve the interface electrical characteristics, a structure in which the silicon oxide film is inserted into the interface between the high dielectric constant film and the silicon substrate as an interface oxide layer is being studied. An interface structure which determines the electrical characteristics is deeply related to a fabrication method of the high dielectric constant thin film. For example, even if the high dielectric constant thin film is directly deposited on the surface of the silicon substrate by means of the CVD or sputtering method, oxidation of the silicon substrate progresses concurrently with thin film deposition to form an interface layer mainly comprising the silicon oxide film when an oxidizing agent is introduced during the deposition, or when a large amount of residual oxygen are present within deposition apparatus. It is difficult to independently control the deposition of these interface layers, thus it being impossible to independently design the structure in which the interface electrical characteristics are optimized.

Meanwhile, techniques in which a silicon oxide film is intentionally inserted as an interface oxide layer include a method of forming an ultra-thin silicon oxide film on a surface of a silicon substrate in advance before depositing a high dielectric constant thin film, and a method of depositing a high dielectric constant thin film before giving heat treatment to allow growth of the silicon oxide film. The former method has an effect that insertion of the silicon oxide film enhances interface thermal stability. However, it is considered to be important that a film thickness of the ultra-thin silicon oxide film which is formed on the surface of the silicon substrate should be 0.6 nm or less due to low relative dielectric constant of the silicon oxide film. In addition, an ultra-thin base silicon oxide film is sometimes altered in a process of depositing the high dielectric constant thin film on the ultra-thin silicon oxide film, and hence interface characteristics between the ultra-thin silicon oxide film and the silicon substrate deteriorate. The latter method is a method utilizing phenomenon in which oxygen easily diffuses in the high dielectric constant thin film to form an interface layer. However, in the case where metal elements in the high dielectric constant film diffuse into the interface layer in a heat treatment process, it is impossible to form an ideal interface between the silicon oxide film and the silicon substrate excellent in the electrical characteristics.

In this way, the prior art had the problems that although in order to improve the interface electrical characteristics of the gate insulating film having high dielectric constant, formation of the high dielectric constant thin film excellent in film quality was necessary, while maintaining a good quality interface between the silicon oxide film and the silicon substrate, it was difficult to separate and control a forming process of the interface layer comprising the silicon oxide film, and a deposition process of the high dielectric constant film.

DISCLOSURE OF THE INVENTION

It is possible that a film thickness of said cap layer is 1 nm or less.

It is possible that the film thickness of said cap layer is 0.5 nm or less.

It is possible that said insulating film structure has the composition modulation in which the composition of silicon in a film thickness direction is high in the lowermost portion and uppermost portion and low in the central portion, in the vicinity of said silicon region.

It is possible that said insulating film structure has the composition modulation in which the composition of said at least one metal element in the film thickness direction is low in the lowermost portion and uppermost portion and high in the central portion, in the vicinity of said silicon region.

It is preferable that Equivalent Oxide Thickness of said insulating film structure be smaller than the Equivalent Oxide Thickness of the silicon oxide film into which said at least one metal element is diffused.

It is possible that said silicon oxide constituting said at least one silicate region is a silicon oxynitride into which nitrogen has been introduced.

It is possible that the concentration distribution of said at least one metal element in said at least one silicate region is derived from the heat treatment under reduced pressure oxygen conditions below atmospheric pressure.

It is possible that said insulating film structure further includes a cap region composed of any one of the silicon nitride and the silicon oxynitride.

It is possible that a thickness of said cap region is 0.5 nm or less.

It is possible that said conductive region comprises the gate electrode, and said insulating film structure comprises the gate insulating film, and that a hysteresis width of gate capacity-bias characteristics is 5 mV or less by an applied gate bias within device operating voltage It is possible that said insulating film structure comprises said silicate region composed of the silicon oxide containing said at least one metal element, and the silicon oxide region composed of the silicon oxide not containing said at least one metal element, and that a physical thickness of said insulating film structure is 3.5 nm or less, the physical thickness of said silicate region being thinner than the physical thickness of said silicon oxide region.

It is possible that the physical thickness of said silicate region is 1.5 nm or less.

It is possible that said conductive region comprises the gate electrode, and said insulating film structure comprises the gate insulating film, the gate electrode having nitride film side walls.

A second aspect of the present invention provides a manufacturing method of a semiconductor device including an insulating film structure which electrically insulates a conductive region from a silicon region, the manufacturing method at least comprising the steps of:

forming a base silicon oxide film on said silicon region;

forming a metal layer on said base silicon oxide film; and giving heat treatment to thereby cause a silicate reaction in an interface between said base silicon oxide film and said metal layer to allow at least one thermally diffused metal element contained in said metal layer into said base silicon oxide film to thereby form the insulating film structure containing a silicate region composed of the silicon oxide containing said at least one metal element thermally diffused into a region of at least part of said base silicon oxide film.

It is possible to carry out said heat treatment causing said interface silicate reaction in reducing atmosphere.

It is possible to carry out said heat treatment causing said interface silicate reaction in atmosphere containing any one of hydrogen and ammonia.

It is possible that said thermally diffused forms said insulating film structure including at least one silicon oxide region composed of the silicon oxide into which said at least one metal element is not diffused by said thermal diffusion, at least one metal rich region into which said at least one metal element has been diffused at high concentration, and said at least one silicate region which is located between said silicon oxide region and said metal rich region and into which said at least one metal element has been diffused at concentration lower than that of said metal rich region.

It is possible that said silicate region has composition modulation in which composition of said at least one metal element increases as closer to said metal rich region and decreases as closer to said silicon oxide region, and, on the other hand, in which the composition of silicon decreases as closer to said metal rich region and increases as closer to said silicon oxide region.

It is possible that said metal rich region comprises a metal oxide not containing silicon.

It is possible that said metal rich region comprises a metal rich silicate having higher concentration distribution of said at least one metal element than that of said silicate region.

It is possible that a process of forming said metal layer comprises a deposition process carried out by setting residual oxygen partial pressure to $1 \times 10^{-6}$ T or less.

It is possible that the deposition process of said metal layer is carried out by causing temperature rise of said silicon region from room temperature.

It is possible to further carry out a nitride treatment process subsequent to said heat treatment process.

It is possible that said nitride treatment process comprises the heat treatment in ammonia.

It is possible that said nitride treatment process comprises nitrogen plasma treatment.

It is possible that said at least one metal element is at least only any one of Zr, Hf, Ta, Al, Ti, Nb, Sc, Y, La, Ce, Pr, Nd, Sm, Eu, Gd, Tb, Dy, Ho, Er, Tm, Yb, and Lu.

It is possible that when said at least one metal element is only Al, a source of the metal element comprises the metal layer abutting on a surface of the base silicon oxide film with a film thickness of not less than 0.6 nm, which extends on said silicon region.

It is possible that said at least one metal element contains at least only any one of Zr, Hf, Ta, Al, Ti, Nb, Sc, Y, La, Ce, Pr, Nd, Sm, Eu, Gd, Tb, Dy, Ho, Er, Tm, Yb, and Lu, and that the source of the metal element comprises the metal layer abutting on the surface of the base silicon oxide film with a film thickness of not less than 1 nm, which extends on said silicon region.

It is possible that a forming process of said metal layer is a process which is carried out on condition that the film thickness of metal deposition is 1 nm or less.

It is possible that the forming process of said metal layer is a process which is carried out on condition that the film thickness of the metal deposition is 0.6 nm or less.

It is possible that said heat treatment process is carried out for the silicate reaction in the interface between said metal layer and said base silicon oxide film to progress to an upper portion of said metal layer, thereby forming said insulating film structure up to and including the uppermost portion from silicate.

When an unreacted metal region is left in said metal layer by said heat treatment process, it is possible to further include a process of removing the unreacted metal region subsequent to said heat treatment process.

It is possible that the process of removing said reacted metal region is carried out by use of a hydrofluoric acid solution or an ammonia peroxide solution.

It is possible to further include the heat treatment process for reforming film quality subsequent to the process of removing said reacted metal region.

It is possible to further include a process of depositing a cap layer composed of a silicon-containing insulating film on said metal layer after the formation process of said metal layer and before said heat treatment process to thereby allow said silicate reaction to cause the thermal diffusion of said at least one metal element into said base silicon oxide film and said cap layer to thereby form a first silicate layer composed of the silicon oxide containing said at least one metal element thermally diffused in a region of at least part of said base silicon oxide film, as well as to form a second silicate layer composed of a silicon insulator containing said at least one metal element thermally diffused in a region of at least part of said cap layer.

It is possible that said cap layer comprises any one of a silicon oxide film, a silicon oxynitride film, a silicon nitride film, and at least two laminated structures of these.

It is possible that the film thickness of said cap layer is 1 nm or less.

It is possible that the film thickness of said cap layer is 0.5 nm or less.

It is possible that said insulating film structure has the composition modulation in which the composition of silicon in the film thickness direction is high in the lowermost portion and uppermost portion and low in the central portion, in the vicinity of said silicon region.

It is possible that said insulating film structure has the composition modulation in which the composition of said at least one metal element in the film thickness direction is low in the lowermost portion and uppermost portion and high in the central portion, in the vicinity of said silicon region.

It is possible that Equivalent Oxide Thickness of said insulating film structure including said silicate region is smaller than the Equivalent Oxide Thickness of said base silicon oxide film.

It is possible that said base silicon oxide film comprises a silicon oxynitride film into which nitrogen has been introduced.

It is possible that said heat treatment process is carried out under reduced pressure oxygen conditions below atmospheric pressure.

It is possible that said silicon region comprises a silicon substrate, said conductive region comprises a gate electrode, and said insulating film structure comprises a gate insulating film.

A third aspect of the present invention provides manufacturing apparatus of a semiconductor device having a gate insulating film which electrically insulates a gate electrode from a silicon substrate, the manufacturing apparatus comprising:

a deposition chamber introducing said silicon substrate on which a base silicon oxide film has been formed;

a metal evaporation mechanism by which a metal layer is deposited on said base silicon oxide film of said silicon substrate introduced into the deposition chamber; and a vacuum pump controlling residual oxygen partial pressure in said deposition chamber, wherein said metal evaporation mechanism allows said vacuum pump to make the residual oxygen partial pressure $1 \times 10^{-6}$ Torr or less to deposit said metal layer on said base silicon oxide film.

It is possible that said manufacturing apparatus further includes a substrate heating mechanism by which said silicon substrate introduced into said deposition chamber is heated.

It is possible that said metal evaporation mechanism allows a spacing between an evaporation source and a substrate to be set to not less than 100 mm to deposit said metal layer on said base silicon oxide film.

BEST MODE FOR CARRYING OUT THE INVENTION

Hereinafter, embodiments of the present invention will be described in detail with reference to the accompanying drawings.

FIG. 1A to FIG. 1D are partial longitudinal sectional views in a manufacturing process of an insulating film structure comprising a silicate high dielectric constant thin film included in a semiconductor device in one embodiment according to the present invention. FIG. 2 is a diagram showing concentration distribution of metal elements in a film thickness direction of the silicate high dielectric constant thin film included in a gate insulating film structure in one embodiment according to the present invention.

Figure 1A:
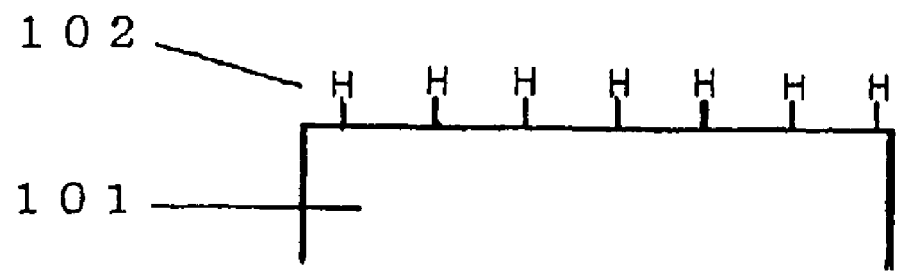
FIG. 1A to FIG. 1D are longitudinal sectional views in a manufacturing process of an insulating film structure comprising a silicate high dielectric constant thin film included in a semiconductor device in one embodiment according to the present invention.
Figure 1B:
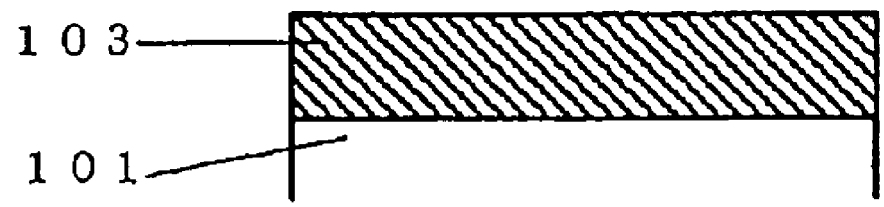
Figure 1C:
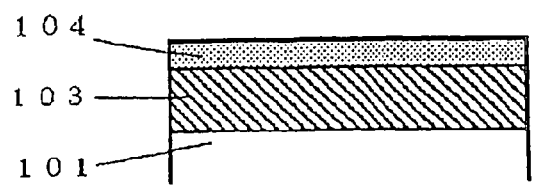
Figure 2:
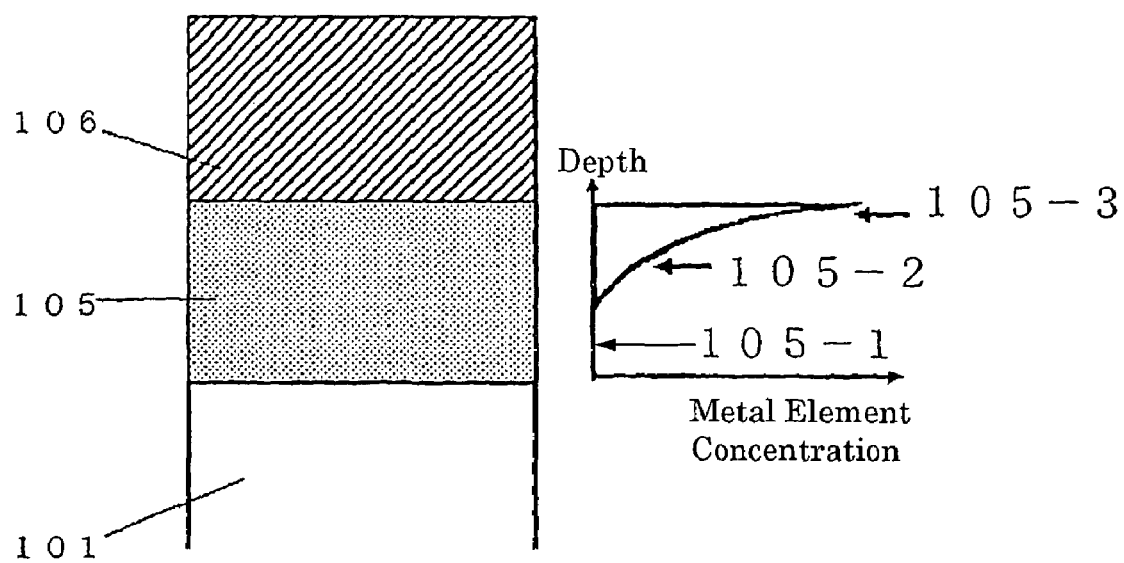
FIG. 2 is a diagram showing metal element concentration distribution in a film thickness direction of the silicate high dielectric constant thin film included in a gate insulating film structure in one embodiment according to the present invention.

In a manufacturing process of a high dielectric constant thin film in the present embodiment, after giving hydrogen termination treatment to a surface of a silicon substrate 101 shown in FIG. 1A, a base silicon oxide film 103 comprising an oxynitride film is formed, as shown in FIG. 1B. As shown in FIG. 1C, metal elements are supplied to the surface of the base silicon oxide film to form a metal layer 104. As shown in FIG. 1C, an insulating film structure 105 including a silicate region is formed on the silicon substrate 101 by heat treatment. A high dielectric constant film layer comprising silicate is not directly deposited on the silicon substrate 101, but the insulating film structure 105 including the silicate region is formed on the silicon substrate 101 as a high dielectric constant thin film by causing an interface reaction between the base silicon oxide film 103 and the metal layer 104 by heat treatment.

First, a high quality base silicon oxide film 103 is formed on the surface of the silicon substrate 101, as shown in FIG. 1B. Note that the silicon substrate 101 is being given the hydrogen termination treatment which eliminates unstable dangling bonds by binding a surface termination hydrogen 102 with remaining valence arms of silicon atoms. A film thickness of the base silicon oxide film 103 is preferably set thickly as compared with normally 0.6 nm or less which is a film thickness of a conventional surface insertion layer, and an electrical film thickness of the insulating film structure 105 which is finally required, namely, the base silicon oxide film 103 as thick as Equivalent Oxide Thickness is formed. Although detailed description will be given with reference to FIG. 2 later, the insulating film structure 105 includes a silicate region 105-2 which acts as the high dielectric constant film into which metal elements are introduced by the interface reaction, and a silicon oxide region 105-1 into which no metal elements are introduced.

A formation method of the base silicon oxide film 103 shown in FIG. 1B needs no particular limits, but may adopt a known thermal oxide film formation process as one typical example. In this case, the base silicon oxide film 103 is required to be ultrathin as thin as the Equivalent Oxide Thickness of a high dielectric constant gate insulating film structure 105 which is finally formed, so that RTO (Rapid Thermal Oxidation) is useful. Note that chemical oxide formed by wet processing is capable of easily forming an ultrathin base silicon oxide film 103, but has the possibility to exert little effect in the present invention due to inferiority in interface electrical characteristics. Furthermore, from a viewpoint of reducing the Equivalent Oxide Thickness, it is required that the film thickness of the base silicon oxide film 103 which is formed on the surface of the silicon substrate 101, that is, the film thickness of the base silicon oxide film 103 before the interface reaction is caused be reduced, as a process shown in FIG. 1B. However, in order to consider that metal elements are diffused into the base silicon oxide film 103 in a process to be described later, and to maintain high quality of an interface between the base silicon oxide film 103 and the silicon substrate 101, it is preferable that the film thickness of the base silicon oxide film 103 be normally not less than 1 nm. However, when selecting an element in which diffusion of metal elements into the base silicon oxide film 103 is not so noticeable as Al, the film thickness of the base silicon oxide film may be reduced to the extent of approximately 0.6 nm at minimum.

In addition, it is useful that an oxynitride film in which trace nitrogen, for example, as much as a few percent is introduced into the base silicon oxide film 103 is used as a base layer. In this case, useful is a structure in which the surface of the base silicon oxide film 103 is selectively nitrided by a radical nitriding process such that nitrogen is not segregated into the interface.

Figure 1D:
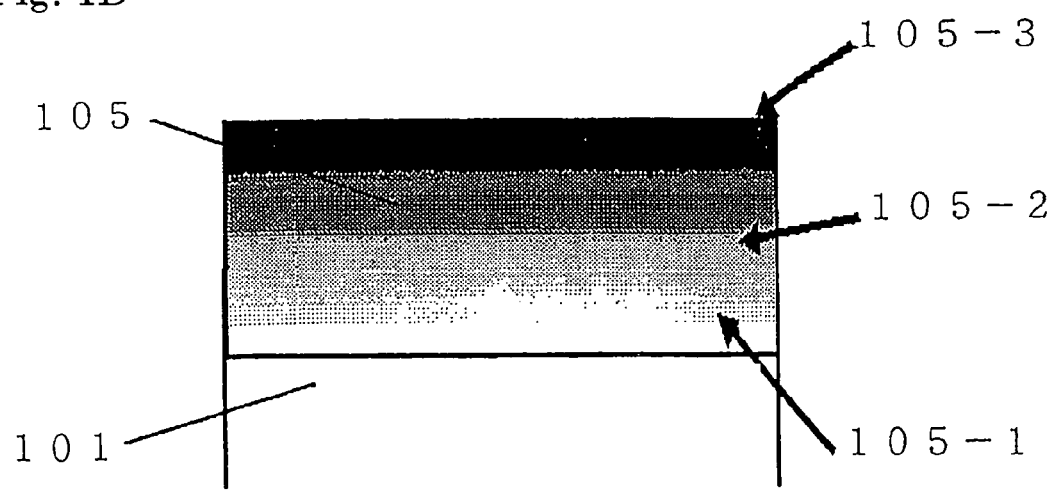

Next, as shown in FIG. 1C and FIG. 1D, metal elements constituting silicate are supplied onto the surface of the base silicon oxide film 103, and then the metal elements are diffused into the base silicon oxide film 103 by the heat treatment process carried out either during or after supplying the metal elements to form a silicate layer 105-2 in which silicon oxidation is converted into silicate, in a region except for the vicinity region of the interface with the silicon substrate 101 which is part of the base silicon oxide film 103, in particular, on an upper layer portion of the base silicon oxide film 103.

A physical evaporation method such as a CVD chemical method and sputter deposition is conceivable as a means for supplying the metal elements to the surface of the base silicon oxide film 103. Particularly, considering that oxidation rate of the metal elements constituting the high dielectric constant film is very fast, it is preferable to adopt an ultrahigh vacuum sputtering method which is capable of reducing residual oxygen partial pressure in treatment atmosphere during a formation process of the metal layer 104 shown in FIG. 1B to $1\times10^{-6}$ Torr or less. In addition, metal deposition by a sputtering method requires to reduce damage to the base silicon oxide film 103 during the deposition, and outweighs spacing a distance between a sputter evaporation source and the silicon substrate 101 and supplying metal on condition that fast ions or a large amount of photons do not enter the silicon substrate 101. In general, a distance between an evaporation source and a substrate wafer needs to be not less than 100 mm, and a remote type of deposition apparatus having secured a distance of not less than 200 mm is preferable. Furthermore, an ideal method of supplying metal includes a vacuum evaporation method by electron beam heating of metallic materials, and the like.

In a process of supplying the metal elements to form the metal layer 104, atomospheric gas and a degree of vacuum are important, as described above. More specifically, it is difficult to maintain an ideal interface with the silicon substrate 101 because in conventional deposition methods by metal evaporation in oxygen atmosphere, such as reactive sputtering and reactive evaporation, an oxidation reaction progresses along with supply of the metal elements to form a stoichiometric metal oxide, leading to a progress of the interface reaction from an early stage of the deposition. However, if the metal elements are supplied onto the base silicon oxide film 103 of not less than 1 nm which is ever-thicker, on condition that the residual oxygen partial pressure is $1\times10^{-6}$ Torr or less during supplying the metal elements as with the present invention, part of the metal elements might come into an oxidized state by an effect of trace residual oxygen, but an interface structure between the base silicon oxide film 103 and the silicon substrate 101 is well preserved.

In the heat treatment process, the interface reaction is accelerated in an oxidation process of a metal reaction region containing a large amount of oxygen deficiencies. This makes it possible to effectively carry out an interface silicate reaction between the base silicon oxide film 103 and the metal layer 104 in the heat treatment process. For example, if Zr elements are supplied to the base silicon oxide film 103 by use of the vacuum evaporation method on condition that the residual oxygen partial pressure is $1\times10^{-6}$ Torr or less, no changes will occur in a state of Si—O bonding in a film of the base silicon oxide film 103, and most of the Zr elements will be oxidized even under the aforementioned residual oxygen partial pressure due to very fast oxidation rate of the Zr elements. However, the fact that a large amount of oxygen deficiencies are present in the metal reaction region, with a structure of disordered atomic arrangement may be confirmed by evaluation methods of X-ray photoelectron spectroscopy and the like, thus making it possible to effectively carry out the interface silicate reaction in the heat treatment process. In contrast with this, if the supply of the metal elements is carried out on condition that the residual oxygen partial pressure is higher than $1\times10^{-6}$ Torr, the amounts of oxygen deficiencies in the metal reaction region will dramatically drop and the interface silicate reaction will be suppressed in the heat treatment process.

Note that only introduction of the metal elements into the base silicon oxide film 103 leads to a silicate structure containing a large amount of oxygen deficiencies, but giving additional reduced pressure oxidation treatment after the metal diffusion into the base silicon oxide film 103 enables the oxygen deficiencies of the silicate layer 105-2 to be eliminated, while maintaining an interface state with the silicon substrate 101, because oxygen diffusion in the high dielectric constant thin film such as silicate rapidly progresses as compared with the oxygen diffusion in the base silicon oxide film 103, and further oxidation rate of the metal elements is very fast.

On the other hand, the interface between the high dielectric constant thin film such as $HfO_2$ and $ZrO_2$ and the silicon substrate 101 is thermally stable. However, if metal elements constituting the silicate layer 105-2 which is a high dielectric constant film, is supplied onto the surface of the base silicon oxide film 103, Metal-O bonding which is a bonding of a metal atom with an oxygen atom, is stronger than Si—O bonding, so that silicate bonding (Metal-O—Si) will be formed, and an interface silicate formation reaction may be driven by temperature rise of the substrate during supplying the metal elements or the heat treatment process after supplying the metal elements. Consequently, the interface reaction will be accelerated faster than interface oxidation rate through the metallic oxide having stoichiometric film composition.

Meanwhile, in a process of supplying the metal elements to form the metal layer 104, the temperature rise of the silicon substrate 101 is also effective. Oxidation of the metal layer 104 is likely to progress even in reduced residual oxygen partial pressure apparatus because of very fast oxidation rate of the metal elements. Accordingly, it is useful to cause the temperature rise of the silicon substrate 101 during supplying the metal elements to accelerate a reaction with the base silicon oxide film 103, namely, metal element diffusion at the same time as supplying the metal elements. However, even if a temperature of the silicon substrate 101 is made room temperature, a large amount of the oxygen deficiencies are present in the metal reaction region as described above. Therefore, even if the heat treatment is carried out after supplying the metal elements, the interface reaction, namely, the metal element diffusion is accelerated.

It is conceivable that conditions for the heat treatment process include a condition under which oxygen partial pressure is reduced with the primary object of the metal element diffusion, and a condition under which atmosphere contains oxygen with the primary object of oxygen deficiency reduction. However, the oxygen deficiency reduction in the silicate layer 105-2 progresses even under trace oxygen partial pressure, so that the oxygen partial pressure during the heat treatment may be reduced to achieve a condition under which oxidation of the interface between the base silicon oxide film 103 and the silicon substrate 101 is arrested.

This provides a structure in which optimizing process conditions for the metal element diffusion into the base silicon oxide film 103 prevents the metal elements from reaching the interface between the base silicon oxide film 103 and the silicon substrate 101, as well as provides the insulating film structure 105 composed of a silicon oxide region 105-1, a silicate region 105-2, and a metal rich region 105-3, as shown in FIG. 1D.

As shown in FIG. 2, in metal element concentration distribution in a film thickness direction, namely, depth direction of the insulating film structure 105, metal element concentration is highest on the surface of the insulating film structure 105, and decreases with increasing the depth of the insulating film structure 105, resulting in approximately zero of the metal element concentration at a certain depth from the surface of the insulating film structure 105. More specifically, no metal elements are diffused in a region near the interface with the silicon substrate 101, so that the metal element concentration is substantially zero. In other words, in the insulating film structure 105, a region near the interface with the silicon substrate 101 gets into the silicon oxide region 105-1 not containing metal elements. In the interface between the insulating film structure 105 and the silicon substrate 101, the interface structure as good quality as that provided immediately after the base silicon oxide film 103 is formed on the surface of the silicon substrate 101 in a process shown in FIG. 1B can be maintained. On the other hand, the metallic composition is high in an upper portion of the insulating film structure 105, whereas on the surface of the insulating film structure 105, a metal oxide not containing silicon, or metal rich silicate is determined, depending upon a metal diffusion process or a heat treatment condition. The upper region comprising this metal oxide or metal rich silicate is called the metal rich region 105-3. In the insulating film structure 105, a region between the silicon oxide region 105-1 and the metal rich region 105-3 is called the silicate region 105-2. The silicate region 105-2 has composition modulation, and the metal element concentration, namely, metallic composition increases and silicon composition decreases as closer to the metal rich region 105-3, whereas the metal element concentration, namely, the metallic composition decreases and the silicon composition increases as closer to the silicon oxide region 105-1. More specifically, the insulating film structure 105 abuts on the silicon substrate 101, and comprises the following regions: one being the silicon oxide region 105-1 into which no metal elements are introduced by the aforementioned interface reaction, one being a composition-modulated silicate region 105-2 extending on the silicon oxide region 105-1 and having the composition modulation by introduction of the metal elements associated with the aforementioned interface reaction, and one being the metal rich silicate region 105-3 extending on the silicate region 105-2 and having high metal element concentration, namely, metallic composition. Note that a gate electrode 106 formed on the insulating film structure 105 containing the silicate region is shown in FIG. 2.

The metal elements supplied onto the surface of the base silicon oxide film 103 to form silicate include Zr, Hf, Ta, Al, Ti and Nb, or Sc and Y which are rare-earth elements, or La, Ce, Pr, Nd, Sm, Eu, Gd, Tb, Dy, Ho, Er, Tm, Yb, and Lu which are lanthanoid series. A fabrication method of the high dielectric constant film proposed by the present invention may be applied to all of these metal elements, but metal diffusion rate into the base silicon oxide film 103 varies depending upon the difference in material properties. For example, a lanthanoid oxide represented by La has properties of being likely to mix with a silicon oxide, and the metal diffusion into the base silicon oxide film 103 relatively easily progresses. On the other hand, diffusion of Al and the like into the base silicon oxide film 103 is unlikely to progress, but forms an interface layer from a viewpoint at an atomic level. In addition, properties of Zr, Hf, and the like are positioned in the middle of these properties. Accordingly, it is necessary to optimize metal supply and diffusion conditions for each of the aforementioned materials.

Among these, the film thickness of a metal deposition layer dependent on metal supply is an important process parameter which determines the properties of a semiconductor device due to the following reasons. When the film thickness of the metal deposition is thicker than necessary, despite a progress of silicate formation in the interface with the base silicon oxide film, the metallic composition is high in the upper portion of the metal layer, and in some cases, a thick metal oxide layer not containing silicon is formed. This metal oxide layer not containing silicon has a high relative dielectric constant, and is effective in reducing leakage current which passes through a gate insulating film, but the thermal stability deteriorates. Furthermore, when fixed charge density in the metal oxide is high, a problem involved in the reliability such that device operating voltage shifts occurs. Therefore, in formation of a silicate high dielectric gate insulating film excellent in electrical characteristics, it is important to optimize the film thickness of the metal deposition layer in addition to optimization of the aforementioned base oxide film thickness.

In addition, it is preferable that as for diffusion reaction between the base silicon oxide film and the upper metal layer, all regions of the metal layer 104 react. In the case where unreacted regions are left in the metal layer 104, characteristic deterioration of the gate insulating film will be caused. In such a case, the unreacted regions in the metal layer 104 may be removed or separated to utilize only regions formed by the interface reaction with the base silicon oxide film as the gate insulating film.

Figure 3A:
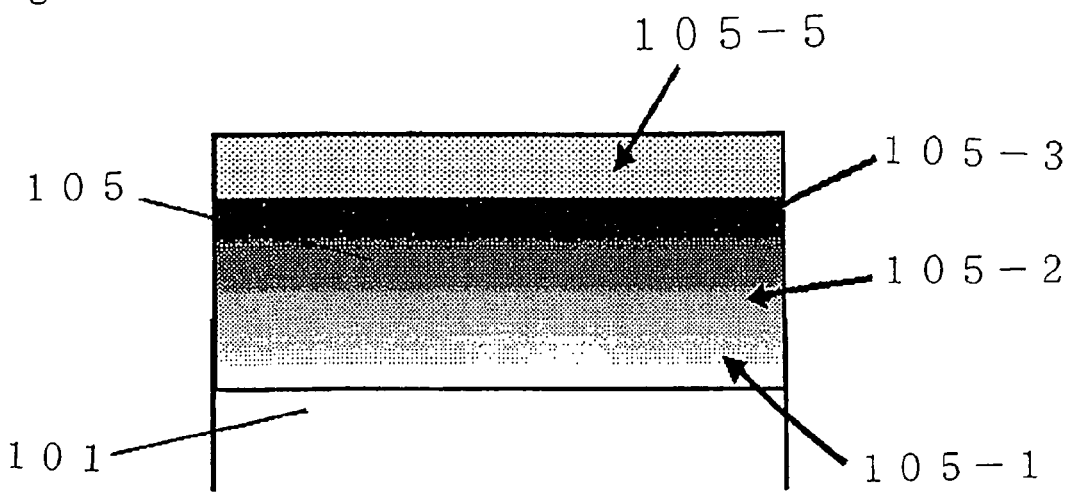
FIG. 3A is a longitudinal sectional view showing the insulating film structure in which an unreacted region is left on an upper portion of a metal layer by an interface reaction between the metal layer and the base silicon oxide film in FIG. 1C.
Figure 3B:
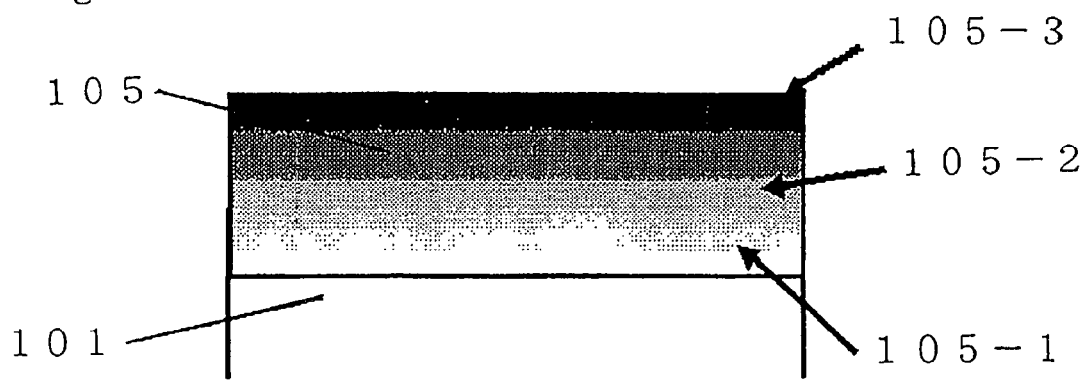
FIG. 3B is a longitudinal sectional view showing the insulating film structure after removing an upper unreacted region and further carrying out reforming heat treatment shown in FIG. 3A.

FIG. 3A is a longitudinal sectional view showing the insulating film structure 105 in which an unreacted region 105-5 is left on the upper portion of the metal layer 104 by the interface reaction between the metal layer 104 and the base silicon oxide film 103 in FIG. 1C. The insulating film structure 105 shown in FIG. 3A includes the following regions: one being the silicon oxide region 105-1 which abuts on the silicon substrate 101, and into which no metal elements are introduced by the aforementioned interface reaction, one being the composition-modulated silicate region 105-2 which extends on the silicon oxide region 105-1, and has the composition modulation by introduction of the metal elements associated with the aforementioned interface reaction, one being the metal rich silicate region 105-3 which extends on the silicate region 105-2, and has high metal element concentration, namely, metallic composition, and one being an upper unreacted metal region 105-5 which extends on the metal rich silicate region 105-3. As described above, the upper unreacted metal region 105-5 causes the characteristic deterioration of the gate insulating film, so that the upper unreacted metal region 105-5 is removed, followed by further carrying out reforming heat treatment. FIG. 3B is a longitudinal sectional view showing the insulating film structure 105 after the upper unreacted region 105-5 shown in FIG. 3A has been removed, followed by further carrying out the reforming heat treatment. The unreacted metal region 105-5 is capable of being removed, for example, by etching. As a wet etching solution, a solution based on a diluted hydrofluoric solution or an ammonia peroxide solution may be used. Furthermore, the characteristics of the gate insulating film may be improved by giving additional heat treatment subsequent to a process of removing the unreacted metal region 105-5.

In addition, the heat treatment process for implementing the metal diffusion into the base silicon oxide film 103 from the metal layer 104 shown in FIG. 1C is carried out in reducing atmosphere, thereby making it possible to more effectively implement the diffusion reaction of the metal into the base silicon oxide film 103. This is intended to cause oxygen deficiencies in the aforementioned upper reacted region to accelerate the metal diffusion into the base silicon oxide film 103 by carrying out the heat treatment on condition that oxygen atoms are taken from the metal diffusion. Hydrogen atmosphere and ammonia atmosphere are effective as the aforementioned reducing atmosphere. Furthermore, it is preferable to give the heat treatment in oxygen atmosphere, namely, oxidation treatment subsequent to the treatment in the aforementioned reducing atmosphere to thereby offset the oxygen deficiencies in a metal silicate film formed by the interface reaction.

In addition, after forming the aforementioned various high dielectric constant gate insulating films, nitrogen introduction into the films is effective in improving thermal resistance of the high dielectric constant film. The aforementioned nitride process includes the heat treatment in ammonia, or nitrogen plasma treatment.

In addition, it is effective to form a cap layer comprising a silicon nitride film with a film thickness of 1.0 nm or less, and preferably 0.5 nm or less, or a cap layer comprising a silicon oxynitride film, with the aim to suppress the interface reaction between a high dielectric constant insulating film 105 and the gate electrode 106 after forming the aforementioned various high dielectric constant gate insulating films 105 and before forming the gate electrode 106.

Figure 4:
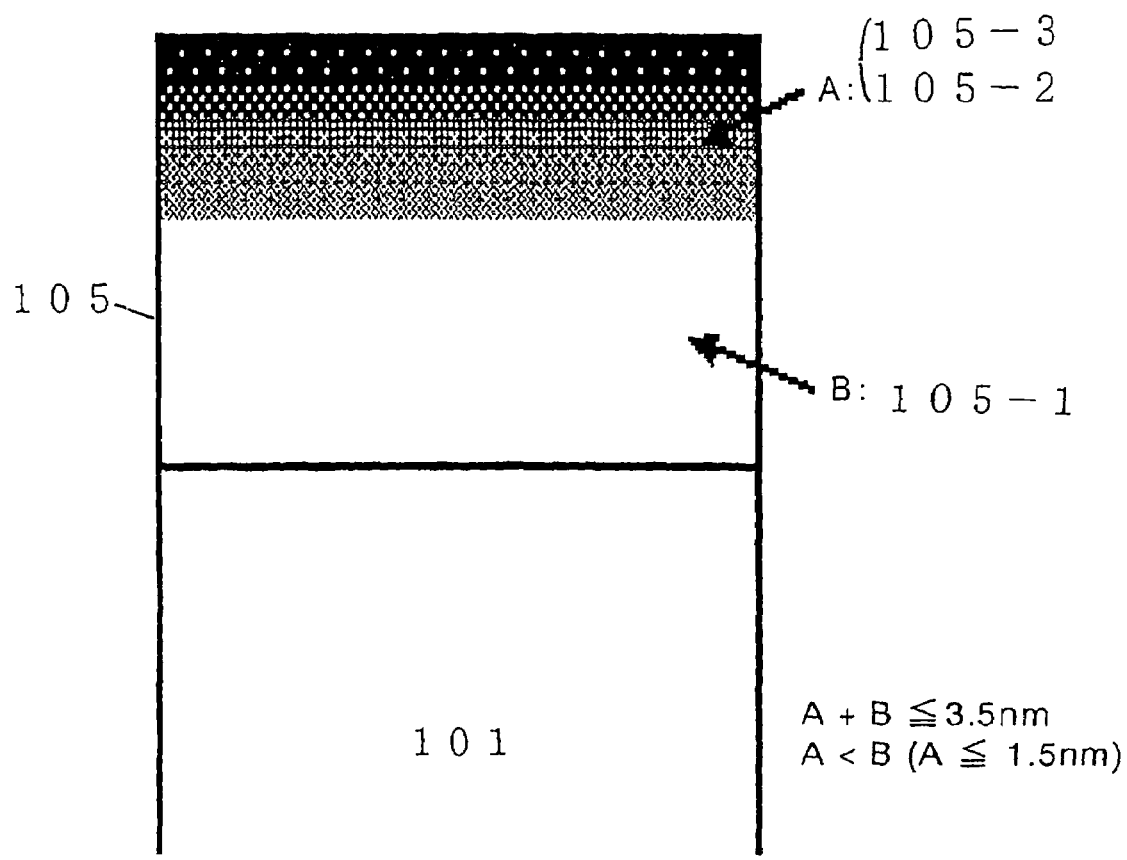
FIG. 4 is a diagram for illustrative of a relationship of physical film thicknesses A and B of the gate insulating film, namely, the physical film thickness A of a metal silicate region containing metal elements and the physical film thickness B of a silicon oxide region not containing metal elements, in the gate insulating film.

Effective is the gate insulating film structure characterized in that a high quality high dielectric constant gate insulating film structure 105 has the gate insulating layer 105 with a physical film thickness of 3.5 nm or less, which is provided between the silicon substrate 101 and the gate electrode 106, and the physical film thickness of a metal-containing silicate layer present on its upper layer portion is thinner than the film thickness of the base silicon oxide film initially formed, and shown in FIG. 1C. FIG. 4 is a diagram for illustrative of a relationship of thicknesses A and B, the thickness A of the metal silicate region containing metal elements, and the thickness B of the silicon oxide region not containing metal elements in the gate insulating film 105. Here, the metal silicate region containing metal elements is equivalent to the composition modulated silicate region 105-2 and the metal rich silicate region 105-3 in FIG. 3B, whereas the silicon oxide region not containing metal elements is equivalent to the silicon oxide region 105-1 in FIG. 3B. Furthermore, from a viewpoint of improvement in the electrical characteristics and reliability of the gate insulating film 105, the thickness A of the metal silicate region is preferably 1.5 nm or less.

Figure 5:
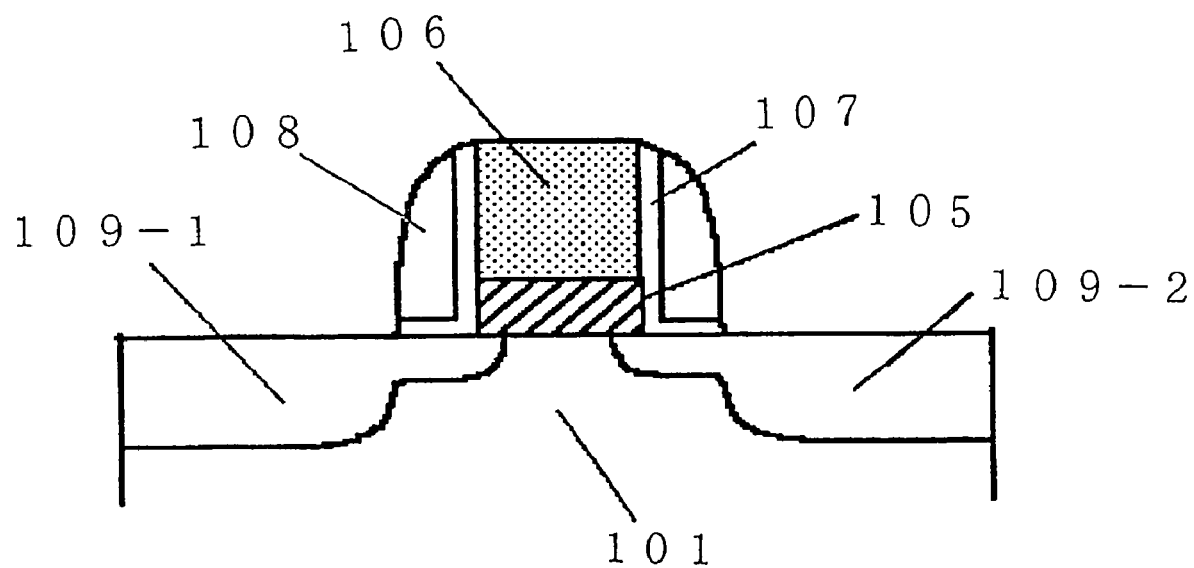
FIG. 5 is a partial longitudinal sectional view showing an example of a semiconductor device to which the insulating film structure is applied according to the present invention shown in FIG. 2.

FIG. 5 is a partial longitudinal sectional view showing one example of a semiconductor device to which the insulating film structure according to the present invention shown in FIG. 2 is applied. A Field Effect Transistor comprises the silicon substrate 101, a source region 109-1 and a drain region 109-2 selectively formed in the silicon substrate 101, the gate insulating film 105 having the aforementioned insulating film structure formed on the surface of the silicon substrate 101, the gate electrode 106 formed on the gate insulating film 105, nitride film side walls 107 formed on side walls of the gate electrode 106, and oxide film side walls 108 formed on the nitride film side walls 107. The silicon nitride film side walls 108 are preferably provided with the aim to protect a gate side wall portion exposed after gate etching.

Furthermore, the aforementioned high dielectric constant gate film is characterized in that hysteresis of a gate capacity-gate voltage curve by an applied bias within the device operating voltage is 5 mV or less.

In addition, the aforementioned description has indicated a process of forming the metal layer which is to be a metal diffusion source, on the base silicon oxide film to heat-treat this laminated structure as silicate formation using the interface reaction between the silicon oxide film and the metal layer. However, it is also possible that after forming the metal layer on the base silicon oxide film, an upper cap layer is further formed on the metal layer, and then the heat treatment is given to cause the metal diffusion from the metal layer into the upper cap layer and the base silicon oxide film, both of which are above and under the metal layer, to form the metal silicate gate insulating film having the component modulation.

FIG. 6A to 6D are partial longitudinal sectional views in the manufacturing process of the insulating film structure comprising the silicate high dielectric constant thin film included in a semiconductor device in another embodiment according to the present invention.

Figure 6A:
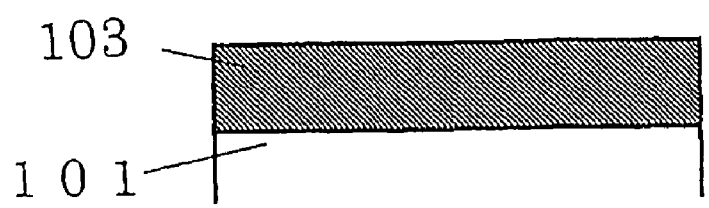
FIG. 6A to FIG. 6D are partial longitudinal sectional views in the manufacturing process of the insulating film structure comprising the silicate high dielectric constant thin film included in a semiconductor device in another embodiment according to the present invention.
Figure 6B:
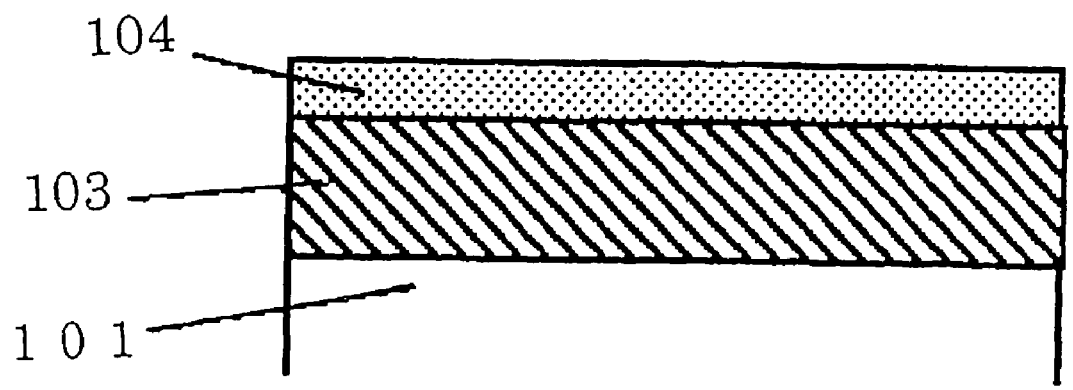
Figure 6C:
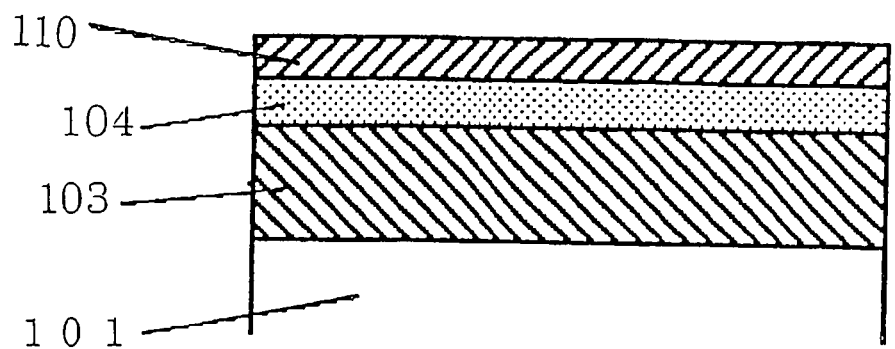
Figure 6D:
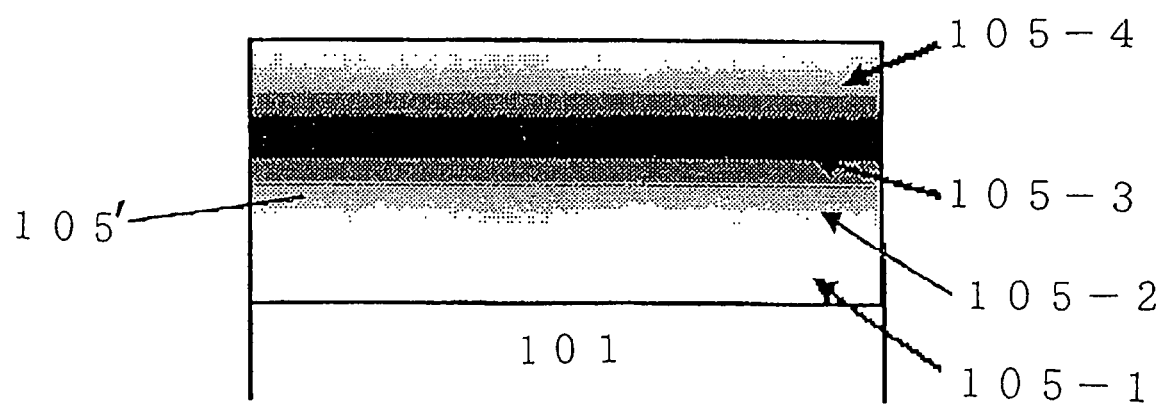

As shown in FIG. 6A, the base silicon oxide film 103 is formed on the silicon substrate 101. As shown in FIG. 6B, the metal elements are supplied onto the surface of the base silicon oxide film 103 to form the metal layer 104. As shown in FIG. 6C, a cap layer 110 is formed on the metal layer 104. As shown in FIG. 6D, the insulating film structure 105 including the silicate region is formed on the silicon substrate 101 by the heat treatment. A high dielectric constant film layer comprising silicate is not directly deposited on the silicon substrate 101, but the metal is thermally diffused from the metal layer 104 into the base silicon oxide film 103 and the cap layer 110 to form the insulating film structure 105 including the silicate region shown in FIG. 6D by allowing the heat treatment to cause the silicate reaction in the interface between the base silicon oxide film 103 and the metal layer 104 and in the interface between the cap layer 110 and the metal layer 104. An insulating film structure 105' may be selected from the following regions: one being the silicon oxide region 105-1 which extends on the silicon substrate 101, and into which no metal elements are introduced, one being a first silicate region 105-2 which extends on the silicon oxide region 105-1 and into which the metal elements are thermally diffused by the aforementioned silicate reaction, one being the metal rich region 105-3 which extends on the first silicate region 105-2, and one being a second silicate region 105-4 which extends on the metal rich region 105-3, and into which the metal elements are thermally diffused by the aforementioned silicate reaction. The aforementioned base silicon oxide film 103 may be selected from a combination of a silicon oxide film and a silicon oxynitride film. The cap layer 110 may be selected from the combinations of a silicon layer, a silicon oxide film layer, a silicon nitride layer, and a silicon oxynitride film layer. Furthermore, it is effective to use ultra-thin films of 1 nm or less, preferably 0.5 nm or less as the film thickness of the cap layer 110. Note that the description overlapped with the aforementioned manufacturing process referring to FIG. 1A to FIG. 1D will be omitted to avoid redundancy.

Figure 7:
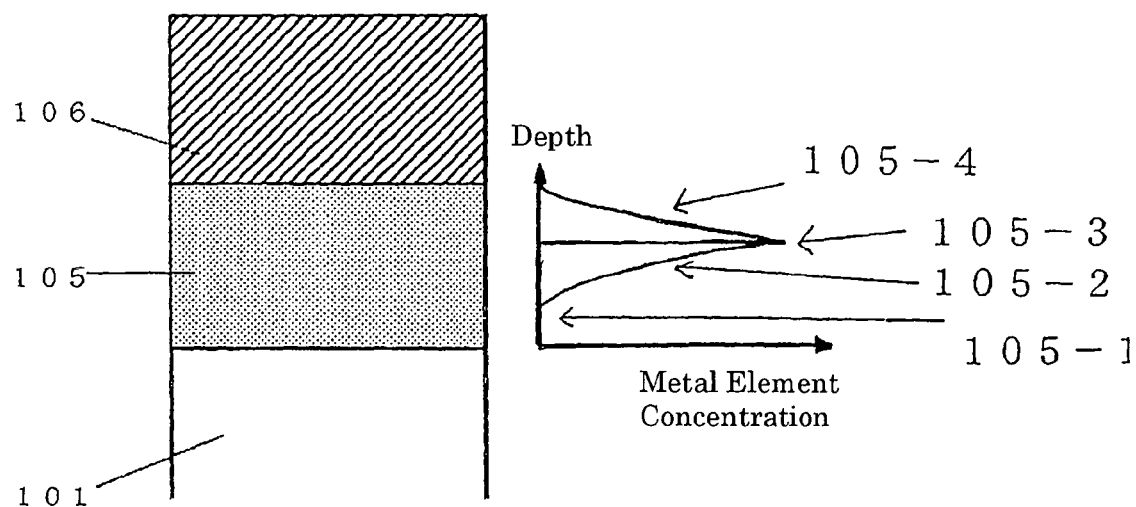
FIG. 7 is a diagram showing the metal element concentration distribution in the film thickness direction of the silicate high dielectric constant thin film included in the insulating film structure shown in FIG. 6D.

FIG. 7 is a diagram showing the metal element concentration distribution in the film thickness direction of the silicate high dielectric constant thin film included in the insulating film structure 105' shown in FIG. 6D. As shown in FIG. 7, for the metal element concentration distribution in the film thickness direction, namely, the depth direction of the insulating film structure 105', the metal element concentration is highest in the metal rich region 105-3, and decreases with increasing the distance from the metal rich region 105-3 in the first and second silicate regions 105-2 and 105-4. More specifically, in the first silicate region 105-2, the metal element concentration decreases with increasing the depth, whereas in the second silicate region 105-4, the metal element concentration increases with increasing the depth. That is, in a region close to the interface with the silicon substrate 101, no metal elements are diffused, so that the metal element concentration is substantially zero. Namely, in the insulating film structure 105', the region close to the interface with the silicon substrate 101 is the silicon oxide region 105-1 not containing metal elements.

EXAMPLES

First Example

Figure 9:
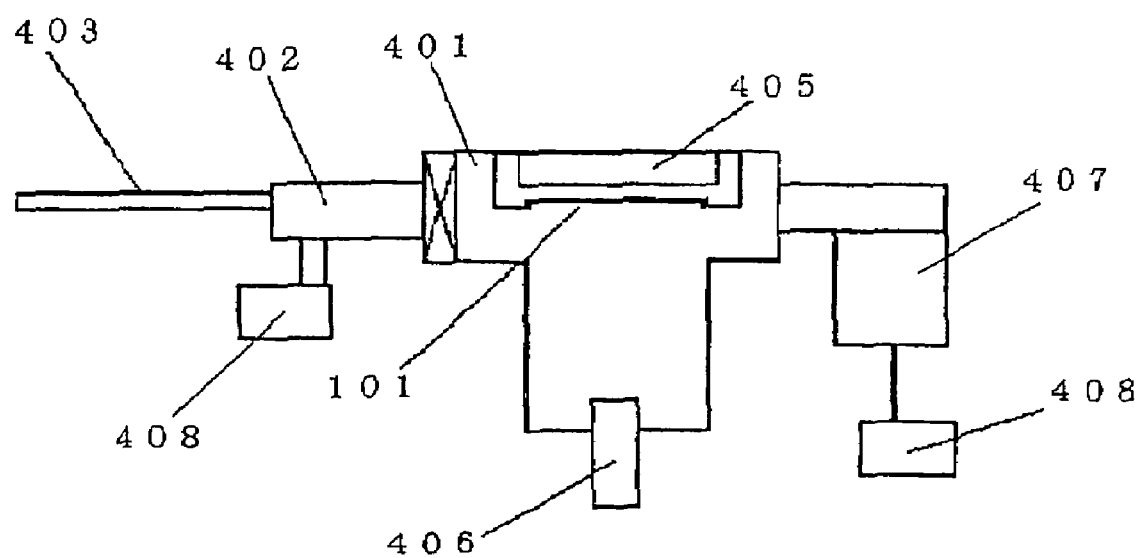
FIG. 9 is a diagram showing an overview of constitution of vacuum evaporation apparatus used for manufacturing the lanthanum silicate high dielectric constant thin film shown in FIG. 8A to FIG. 8D.
Figure 10:
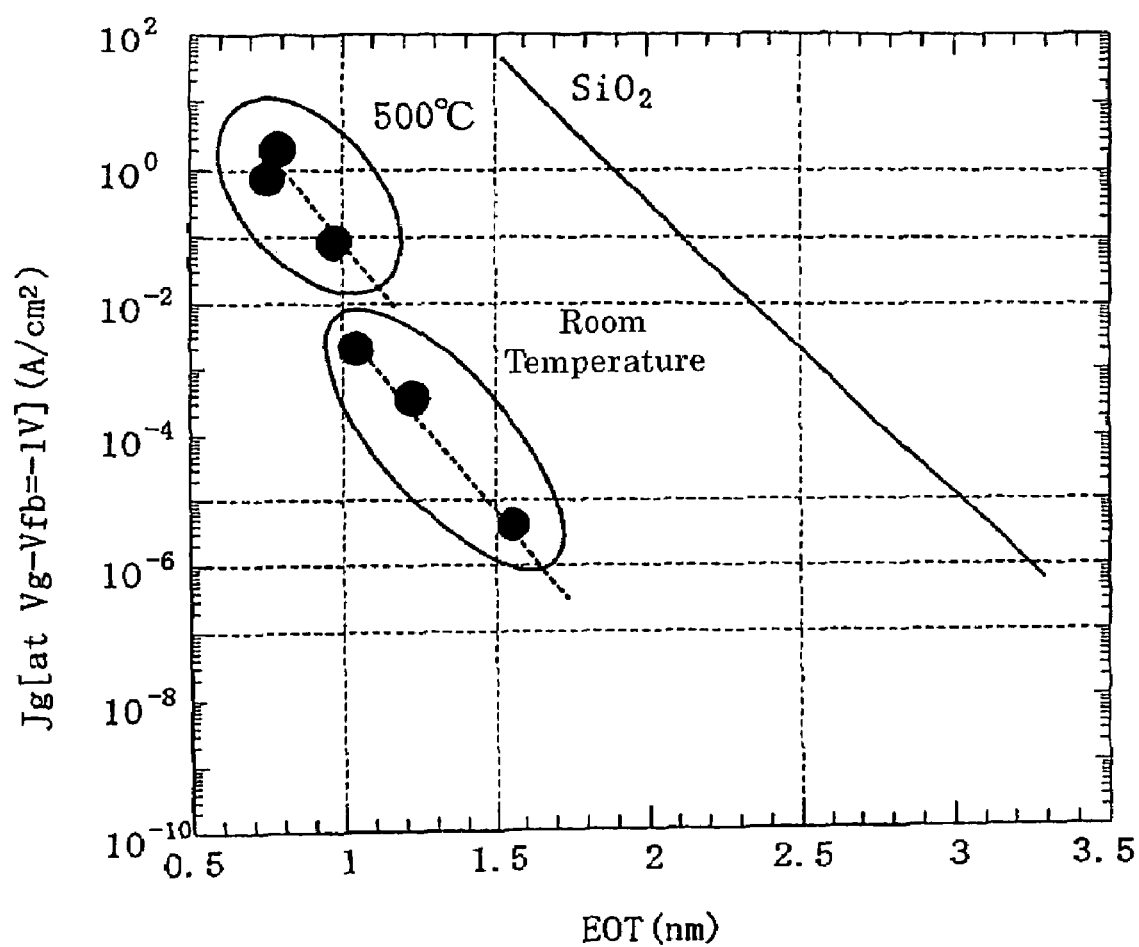
FIG. 10 is a diagram showing the relationship between Equivalent Oxide Thickness and leakage current found from capacity-voltage characteristics and current-voltage characteristics of the lanthanum silicate high dielectric constant thin film shown in FIG. 8D.
Figure 11A:
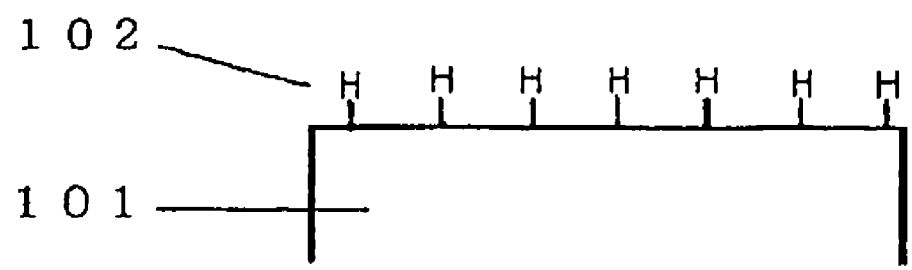
FIG. 11A to FIG. 11D are longitudinal sectional views showing the manufacturing process of a hafnium silicate high dielectric constant thin film included in a semiconductor device of a second example according to the present invention.
Figure 11B:
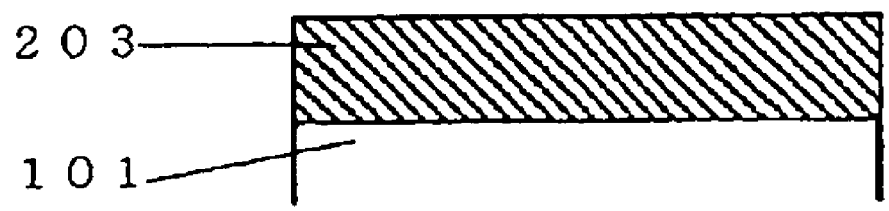
Figure 11C:
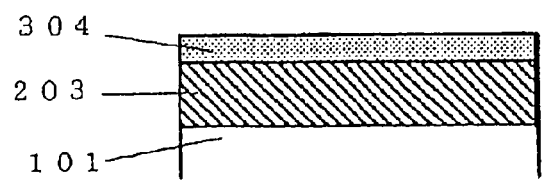
Figure 11D:
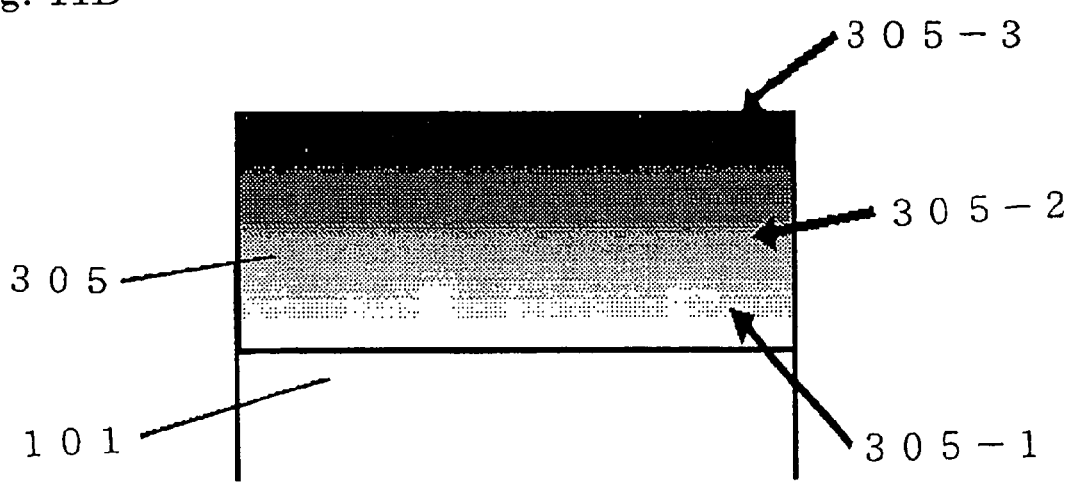

FIG. 8A to FIG. 8D are longitudinal sectional views showing a manufacturing process of a lanthanum silicate high dielectric constant thin film included in a semiconductor device in a first example according to the present invention. FIG. 9 is a diagram showing an overview of constitution of vacuum evaporation apparatus used for manufacturing the lanthanum silicate high dielectric constant thin film shown in FIG. 8A to FIG. 8D. FIG. 10 is a diagram showing a relationship between Equivalent Oxide Thickness and leakage current which are found from capacity-voltage characteristics and current-voltage characteristics of the lanthanum silicate high dielectric constant thin film shown in FIG. 8D.

In the first example, a base silicon oxide film 103 was formed as a base layer, a lanthanum silicate high dielectric constant thin film 205 was formed using La as a metal element, and characteristics of the semiconductor device were verified using the lanthanum silicate high dielectric constant thin film 205.

Figure 8A:
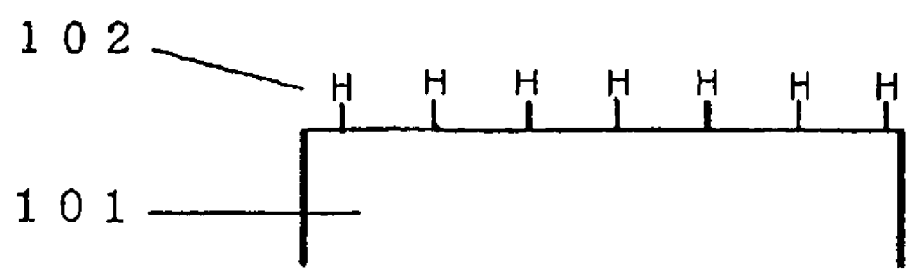
FIG. 8A to FIG. 8D are longitudinal sectional views showing the manufacturing process of a lanthanum silicate high dielectric constant thin film included in a semiconductor device in a first example according to the present invention.
Figure 8B:
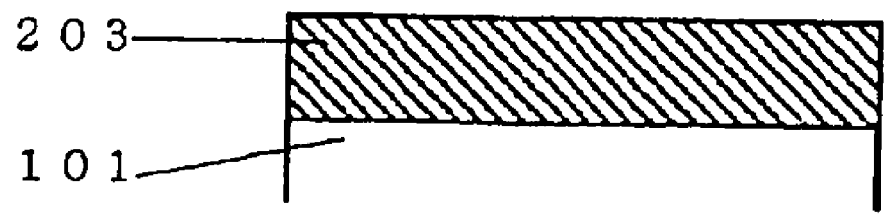
Figure 8C:
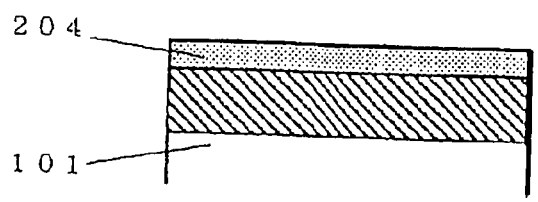
Figure 8D:
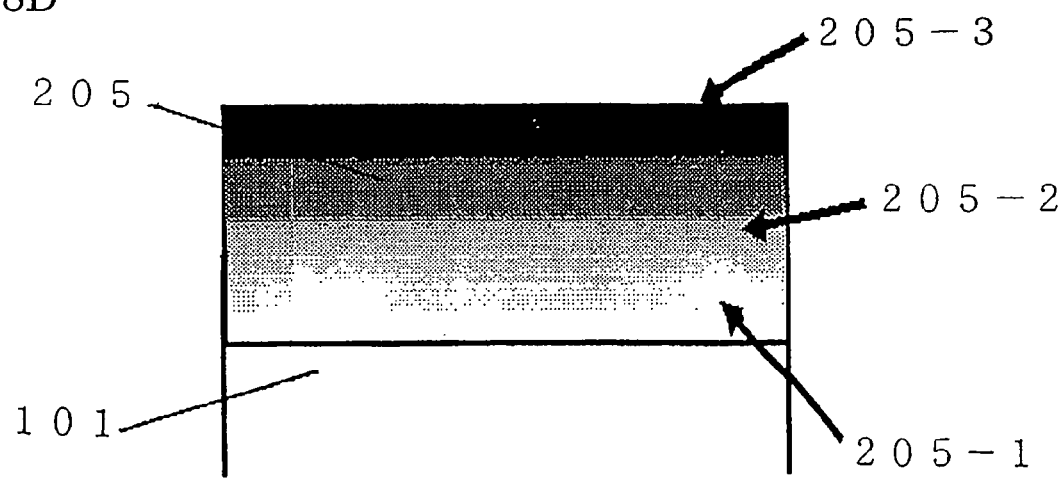

As shown in FIG. 8A, after cleaning of a silicon substrate 101, a surface oxide film was removed with hydrofluoric acid treatment, and the silicon substrate 101 was surface-oxidized by RTO to form the base silicon oxide film 103 with a film thickness of 1.1 nm. The RTO was carried out by making a substrate temperature 700° C. under reduced pressure oxygen conditions (500 Pa).

Next, the silicon substrate 101 in which the base silicon oxide film 103 was formed was mounted on a wafer transportation system 403, and was introduced into a deposition chamber 401 through a wafer introduction chamber 402 to deposit a metal lanthanum layer 204 on the base silicon oxide film 103 by electron beam heating (electron-beam evaporation) of an LA evaporation source using an electron beam evaporation mechanism 406. During deposition of metal elements, a degree of vacuum of the deposition chamber 401 was set to a condition of $2 \times 10^{-9}$ Torr or less by vacuuming with a roughing vacuum pump 408 and a main air pump 407, and a substrate temperature of the silicon substrate 101 was set to 500° C. by room temperature and heating of a substrate heating mechanism 405.

Next, the silicon substrate 101 on which the metal lanthanum layer 204 was deposited was taken out of the deposition chamber 401, and the heat treatment was carried out in nitrogen atmosphere at 500° C. for 10 minutes for the sake of compensation for oxygen deficiencies in the film to form the lanthanum silicate high dielectric constant thin film 205 composed of a silicon oxide film region 205-1, an La silicate region 205-2, and an La rich region 205-3. A heat treatment process may be carried out using a horizontal quartz reactor to cause oxygen introduction into a film and metal diffusion into the base silicon oxide film 103 by means of residual oxygen in treatment atmosphere or adsorption oxygen in wafer transportation.

With respect to the lanthanum silicate high dielectric constant thin film 205 formed in this way, capacity-voltage and current-voltage characteristics were evaluated, and Equivalent Oxide Thickness (EOT) and leakage current (Jg) were measured, which was compared with the characteristics of the base silicon oxide film 103. The comparison result is shown in FIG. 10.

FIG. 10 shows respective characteristic results of samples subjected to comparison under different conditions that a temperature of the silicon substrate 101 during lanthanum deposition was room temperature and 500° C., which reveals that the leakage current is reduced in all the samples, as compared with the base silicon oxide film 103.

In addition, the samples subjected to the comparison carried out by making the temperature of the silicon substrate 101 a temperature of 500° C. during the lanthanum deposition showed that the Equivalent Oxide Thickness was thinner than the film thickness of the base silicon oxide film 103, from which it was confirmed that lanthanum was diffused into the base silicon oxide film 103, and high dielectricity advanced by the aforementioned manufacturing method of the present invention. Furthermore, the thinnest sample of the Equivalent Oxide Thickness among the samples subjected to the comparison carried out by making the temperature of the silicon substrate 101 room temperature during the lanthanum deposition showed that the Equivalent Oxide Thickness was thinner than the film thickness of the base silicon oxide film 103, from which it was confirmed that the high dielectricity by metal diffusion advanced even on condition that the temperature of the silicon substrate 101 was room temperature. In this way, the Equivalent Oxide Thickness had a tendency to be thin in the samples whose substrate temperatures are high during the lanthanum deposition, whereby effects in providing temperature rise to the silicon substrate 101 during the lanthanum deposition were confirmed.

In addition, as a result of having measured interface state density, it was confirmed that defect density was reduced to ⅕ to ⅒ by applying the manufacturing method of the present invention, as compared with the case where the lanthanum silicate was directly deposited on the silicon substrate 101. Furthermore, as a result of having made the lanthanum silicate high dielectric constant thin film 205 a gate insulating film to prototype the MOSFET using a polysilicon gate electrode, the mobility increased by not less than 50%, as compared with the case where the lanthanum silicate was directly deposited on the silicon substrate 101.

Second Example

Figure 12:
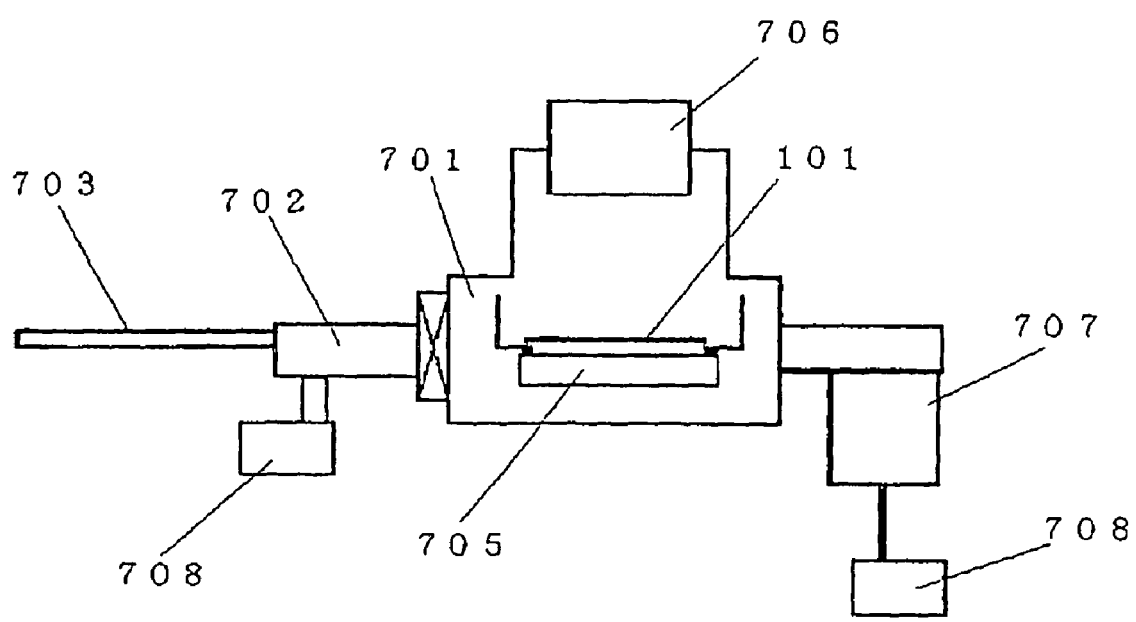
FIG. 12 is a diagram showing an overview of the constitution of sputter-deposition apparatus used for the manufacturing process of the hafnium silicate high dielectric constant thin film shown in FIG. 11A to FIG. 11D.

FIG. 11A to FIG. 11D are longitudinal sectional views showing a manufacturing process of a hafnium silicate high dielectric constant thin film included in a semiconductor device of a second example according to the present invention. FIG. 12 is a diagram showing an overview of constitution of sputter deposition apparatus used for the manufacturing process of the hafnium silicate high dielectric constant thin film shown in FIG. 11A to FIG. 11D.

In the second example, a silicon oxynitride film 203 was formed as a base layer, and a hafnium silicate high dielectric constant thin film 305 was formed using Hf as a metal element, the hafnium silicate high dielectric constant thin film 305 being used to verify characteristics of a semiconductor device. The reason for which the silicon oxynitride film 203 was used as a base oxide film in the second example was for the sake of improvement in thermal resistance by addition of nitrogen to high dielectric constant materials.

After cleaning of a silicon substrate 101, a surface oxide film was removed with hydrofluoric acid treatment to surface-oxidize the silicon substrate 101 by RTO, forming a base silicon oxide film 103 with a film thickness of 1.5 nm. The RTO was carried out by making a substrate temperature 700° C. under reduced pressure oxygen conditions (500 Pa).

Next, nitride treatment for a surface of the base silicon oxide film 103 was carried out by means of vacuum apparatus on which an ECR (Electron Cyclotron Resonance) radical source was mounted as a plasma source to form the silicon oxynitride film 203. The nitride treatment was carried out under irradiation conditions of nitrogen radical at a substrate temperature of 500° C., nitrogen pressure of 0.3 Pa, and input power of 100 W.

Next, the silicon substrate 101 in which the silicon oxynitride film 203 was formed was mounted on a wafer transportation system 703, and introduced into a deposition chamber 701, which was ultrahigh vacuum-enabled remote type of sputter apparatus, through a wafer introduction chamber 702. A sputter evaporation mechanism 706 was then used to carry out metal layer deposition making an Hf target evaporation source and argon sputter gas to deposit an hafnium deposition layer 304 on the silicon oxynitride film 203. During deposition of metal elements, a degree of vacuum of the deposition chamber 701 was set to a condition of 5×10−9 Torr or less by vacuuming with a roughing vacuum pump 708 and a main air pump 707, the substrate temperature of the silicon substrate 101 was set to room temperature, distance between a sputter source and a wafer was set to 300 mm for reducing damage, argon gas partial pressure was set to 0.05 Pa, and input power was set to 500 W.

Next, after the deposition of the hafnium deposition layer 304, continuous heat treatment was carried out at the degree of vacuum of $1\times10^{-6}$ Torr or less at 600° C. for 10 minutes, and then the silicon substrate 101 was taken out of the deposition chamber 701. The heat treatment was further carried out in nitrogen atmosphere at 500° C. for 10 minutes for the sake of compensation for oxygen deficiencies in a film to form the hafnium silicate high dielectric constant thin film 305 composed of a silicon oxynitride film region 305-1, an Hf silicate region 305-2, and an Hf rich region 305-3. A heat treatment process may be carried out using a horizontal quartz reactor to allow residual oxygen in treatment atmosphere, or adsorption oxygen in wafer transportation to cause oxygen introduction into a film and metal diffusion into the base silicon oxide film 103.

As a result of evaluation of capacity-voltage and current-voltage characteristics, it was confirmed that Effective Oxide Thickness was 1.45 nm, and that leakage current was capable of being reduced by three to four digits more than that of a silicon oxide film.

In addition, it was confirmed that the manufacturing method of the present invention was applied to thereby reduce interface defect density by approximately ⅕, as compared with the case where $HfO_2$ was directly deposited on the base silicon oxide film 103 having a thickness of 0.5 nm by a reactive sputtering method in accordance with the prior art. Furthermore, as a result of having evaluated heat treatment-crystallization temperature by the heat treatment, thermal resistance was improved by 50° C. to 100° C. with respect to the hafnium silicate high dielectric constant thin film 305 into which nitrogen was not introduced. On the other hand, as a result of having made the hafnium silicate high dielectric constant thin film 305 a gate insulating film to prototype the MOSFET using a polysilicon gate electrode, the mobility increased by not less than 40%, as compared with the case where the hafnium silicate was directly deposited on the silicon substrate.

In the present second example, it was confirmed that when the MOSFET was fabricated by making a deposited film thickness of metallic hafnium 0.4 to 0.6 nm and 1.0 nm, leakage current values could be reduced by approximately three digits and approximately four digits, respectively, as compared with the silicon oxide film.

In addition, the life of a device (insulating film reliability) estimated from electrical defects (interface defect density: Dit) present in an interface between an insulating film and a silicon substrate, and a threshold voltage shift associated with device operation was evaluated for these devices with different film thicknesses of metallic hafnium. As a result, it was confirmed that in a device fabricated by making the film thickness of metallic Hf 0.4 to 0.6 nm, the interface defect density could be reduced to less than ½, as compared with the one fabricated by making the film thickness of deposition 1.0 nm, and that the life of a device (reliability) could be improved ten times or more. Furthermore, it was confirmed that hysteresis of capacity-gate voltage characteristics (C-V characteristics) within operating voltage of a transistor was 5 mV or less. Accordingly, it was confirmed that from a viewpoint of reduced leakage current and device reliability such as device life, the film thickness of the metal layer was preferably 1 nm or less, and more preferably 0.6 nm or less. The lower limit of the film thickness is not particularly limited as far as a silicate layer having a significant thickness is formed, but the effect is noticeable when the film thickness is, for example, not less than 0.4 nm. In making device design, any film thickness may be selected from such a film thickness range. However, for example, if priority is given to reduced leakage current, silicate deposition making the thickness of a metal deposition layer a value close to 1 nm is effective. On the other hand, if the priority is given to the device reliability, the silicate deposition making the thickness of the metal deposition layer 0.4 to 0.6 nm is effective.

In addition, it was confirmed that a typical structure of a gate insulating film achieving an effect of reducing the leakage current of the gate insulating film and improvement in transistor mobility, as well as ensuring of the reliability had a gross physical film thickness of 3.5 nm or less, and that if a physical film thickness of a base silicon oxide film region (B) not containing metal elements was thicker than the physical film thickness of a silicate region containing metal elements, namely, if a relationship of A<B was satisfied, excellent characteristics could be obtained. The typical example included the physical film thickness of an unreacted base silicon oxide film of 1.4 nm, the physical film thickness of a metal-containing upper silicate layer of 1.2 nm, and an electrical film thickness of 1.75 nm.

Furthermore, for fabrication of the aforementioned transistor structure, a small transistor with a short gate length provided favorable transistor characteristics, when a side wall comprising a silicon nitride film was formed on a gate side wall.

In addition, Hf metal was used as a metal diffusion source in the aforementioned examples, but it is useful to introduce nitrogen as sputtering gas during metal Hf deposition to deposit HfN (hafnium nitride). An Hf silicate film (HfSiON) was able to be fabricated by giving the heat treatment onto the base silicon oxide film with a thickness of 1.5 nm after deposition of HfN in a manner similar to the foregoing. Nitrogen remains as little as approximately 4% in the Hf silicate film because part of nitrogen in a film was thermally desorbed during the heat treatment. However, it was confirmed that nitrogen was introduced into metal silicate by the present deposition method, thereby making it possible to increase the crystallization temperature of the insulating film by 50° C., with improvement in thermal resistance by nitrogen introduction. Additionally, in the case of a metal nitride, from a viewpoint of ensuring of the reliability over the gate insulating film, when the film thickness of a metal nitride film was 1 nm or less, and preferably 0.6 nm or less, the hysteresis of capacity-gate voltage characteristics of the gate insulating film was able to be 5 mV.

As has been described hereinbefore, according to the present embodiment, after forming the base silicon oxide film 103 on a surface of the silicon substrate 101, a metal layer deposition process and the heat treatment process of supplying metal elements which constitute a high dielectric constant film on a surface of the base silicon oxide film 103 allow the metal elements to be diffused into the base silicon oxide film 103 to thereby form an insulating film structure 105 including the silicate region as the gate insulating film, thereby enabling formation of a gate insulating film structure having a good quality interface between the base silicon oxide film and the silicon substrate in the interface between the high dielectric constant thin film and the silicon substrate, with an effect that improvement in interface electrical characteristics, which has been a longstanding task in practical use of the high dielectric constant thin film may be achieved.

Furthermore, according to the present embodiment, independent control of the metal diffusion into the base silicon oxide film 103 allows the metal elements to be diffused only onto the surface side of the base silicon oxide film 103, making it easier to optimize conditions that no metal elements reach the interface between a silicon oxide film and the silicon substrate, with an effect that fabrication of the high dielectric gate insulating film having excellent interface electrical characteristics is enabled.

In these and other embodiments, the film thickness of metal is thinned, and the metal film is completely diffused and made into silicate to achieve silicate deposition. However, if the metal film having a relatively thick film thickness is used, there is a possibility that an unreacted metal region with the base silicon oxide film could remain after the heat treatment. In this case, the unreacted metal region may be removed to use only a region made into silicate as the gate insulating film.

In addition, although the aforementioned first and second examples show the case where a bilayer structure of the base oxide film and the upper metal-containing layer has been used, a silicon or silicon oxide film based cap layer is further formed above the aforementioned bilayer structure before giving the heat treatment, thereby making it possible to form a structure having a silicon rich region on the uppermost layer.

In this case, a silicon cap layer with a film thickness of 0.5 nm was formed by the sputter deposition using an Si target, after the bilayer structure comprising the silicon oxide film and metal Hf had been formed by RTO and sputter deposition similar to those of the second example. Then, treatment was carried out in oxygen atmosphere at 500° C. for two minutes, followed by giving the heat treatment in nitrogen at 900° C. The heat treatment runs formation of a surface silicon oxide film layer by oxidation of a surface silicon cap layer in parallel with the metal diffusion from a metal Hf layer into upper and lower silicon oxide layers to form the silicate layer.

Component distribution in a thickness direction of this silicate layer is high in the lowermost portion abutting on an upper portion of the film and the silicon substrate, and low in the central portion (a portion in which the metal layer was initially formed). In contrast with this, metallic (Hf) composition indicates a maximal value in the vicinity of the central portion of the film, and the Hf composition decreases as closer to a silicon interface and the uppermost portion. Namely, a structure provided with the component distribution has been provided. Additionally, as applications of the aforementioned deposition methods, use of the silicon oxide film, the silicon oxynitride film, and the silicon nitride film as a surface cap layer, and further the use of a metal silicate layer, a metal aluminate layer, a metal oxide layer, and a metal nitride layer as the metal diffusion source were found to be effective.

In the semiconductor device, its manufacturing method, and its manufacturing apparatus of the present invention, after forming the base silicon oxide film on the surface of the silicon substrate, the metal layer deposition process and the heat treatment process of supplying metal elements which constitute the high dielectric constant film on the surface of the silicon oxide film allow the metal elements to be diffused into the silicon oxide film to thereby form the silicate layer as the gate insulating film, thereby enabling formation of the gate insulating film structure having a good quality interface between the silicon oxide film and the silicon substrate in the interface between the high dielectric constant thin film and the silicon substrate, with an effect that improvement in interface electrical characteristics, which has been a longstanding task in practical use of the high dielectric constant insulating film may be achieved.

Furthermore, in the semiconductor device, its manufacturing method, and its manufacturing apparatus of the present invention, independent control of the metal diffusion into the silicon oxide film allows the metal elements to be diffused only onto the surface side of the silicon oxide film, making it easier to optimize the conditions that no metal elements reach the interface between the silicon oxide film and the silicon substrate, with an effect that the fabrication of the high dielectric constant gate insulating film having excellent interface electrical characteristics is enabled.

Note that the number, position, shape and the like of the aforementioned constituent members are not limited to the aforementioned embodiments, and preferred number, position, shape, and the like may be allowed in implementing the present invention. Note that in each figure, the same numerals are given to the same components.

INDUSTRIAL APPLICABILITY

Furthermore, application of the present invention is not limited to specific devices described in the aforementioned examples, as far as a semiconductor device including an insulating film structure which electrically insulates a conductive region from a silicon region is concerned. In addition, the insulating film structure is not limited to a gate insulating film, and the semiconductor device includes one which electrically insulates the conductive region from the silicon region.

While the present invention has been described by linking to some preferred embodiments and examples, it is to be understood that these embodiments and examples are merely illustrative of the present invention with practical examples and not restrictive. While it will be obvious to those skilled in the art that various changes and substitutions by equivalent components and techniques are eased, upon reading the specification, it is believed obvious that such changes and substitutions are included in the true scope and spirit of the accompanying claims.

What is claimed is:

1. A semiconductor device comprising an insulating film structure which electrically insulates a conductive region from a silicon region,
   wherein said insulating film structure extends on said silicon region and under said conductive region, said insulating film structure further comprising at least one silicate region composed of a silicon oxide containing at least one metal element,
   wherein said insulating film structure comprises at least one silicon oxide region composed of a silicon oxide not containing said at least one metal element, at least one metal rich region having high concentration of said at least one metal element, and said at least one silicate region which is located between said silicon oxide region and said metal rich region and has lower concentration of said at least one metal element than that of said metal rich region,
   wherein said silicon oxide region is located on said silicon region, said silicate region being located on said silicon oxide region, said metal rich region being located on said silicate region,
   wherein said silicate region has composition modulation in which composition of said at least one metal element increases toward a surface of the device, and the composition of silicon decreases toward the surface of the device, and
   wherein a second silicate region further extends on said metal rich region, the second silicate region having composition modulation in which composition of said at least one metal element decreases upward, and the composition of silicon increases upward.

* * * * *